(12) United States Patent
Zhang et al.

(10) Patent No.: US 11,169,630 B2
(45) Date of Patent: Nov. 9, 2021

(54) TOUCH PANEL WITH NANOWIRES

(71) Applicant: TPK Advanced Solutions Inc., Xiamen (CN)

(72) Inventors: Yu Zhang, Fujian (CN); Ho-Chien Wu, Xinbei County (TW); Ho-Hsun Chi, Hsinchu County (TW); Liang-Zhen Xu, Fujian (CN)

(73) Assignee: TPK Advanced Solutions Inc., Xiamen (CN)

( * ) Notice: Subject to any disclaimer, the term of this patent is extended or adjusted under 35 U.S.C. 154(b) by 0 days.

(21) Appl. No.: 16/800,091

(22) Filed: Feb. 25, 2020

(65) Prior Publication Data

US 2020/0272260 A1 Aug. 27, 2020

(30) Foreign Application Priority Data

Feb. 25, 2019 (CN) .......................... 201910137310.0

(51) Int. Cl.
*G09G 3/04* (2006.01)
*G06F 3/041* (2006.01)
*H05K 1/14* (2006.01)

(52) U.S. Cl.
CPC ............. *G06F 3/041* (2013.01); *H05K 1/147* (2013.01); *H05K 2201/10151* (2013.01)

(58) Field of Classification Search
CPC .............................................. G06F 3/041–048
See application file for complete search history.

(56) References Cited

U.S. PATENT DOCUMENTS

| | | | |
|---|---|---|---|
| 2014/0300832 A1* | 10/2014 | de Jong ................ | G06F 3/041 349/12 |
| 2015/0107977 A1* | 4/2015 | Lee ....................... | G06F 3/0446 200/5 R |
| 2016/0117032 A1* | 4/2016 | Lin ....................... | G06F 3/04164 345/173 |
| 2017/0153767 A1* | 6/2017 | Citta ..................... | G06F 3/0416 |
| 2017/0192586 A1* | 7/2017 | Lin ....................... | G06F 3/0412 |
| 2019/0087047 A1* | 3/2019 | Zou ...................... | G06F 3/0445 |

* cited by examiner

*Primary Examiner* — Roy P Rabindranath
(74) *Attorney, Agent, or Firm* — Idea Intellectual Limited; Margaret A. Burke; Sam T. Yip (57) ABSTRACT

A touch panel having a visible area and a peripheral area includes a first substrate, a first metal nanowires layer, a first wiring component, and a first conductive adhesive layer. The first metal nanowires layer is formed on the surface of the first substrate and patterned to include a first sensing part corresponding to the visible area and a first connecting part corresponding to the peripheral area. The first wiring component includes a first carrier plate and a first peripheral trace. The first carrier plate is located corresponding to the peripheral area and has a hollow design corresponding to the visible area. The first peripheral trace is disposed on the surface of the first carrier plate adjacent to the side of the first metal nanowires layer. The first conductive adhesive layer, located corresponding to the peripheral area, is disposed between the first metal nanowires layer and the first wiring component.

20 Claims, 8 Drawing Sheets

TOUCH PANEL WITH NANOWIRES

RELATED APPLICATIONS

This application claims priority to China Application Serial Number 201910137310.0, filed Feb. 25, 2019, which is herein incorporated by reference.

BACKGROUND

Field of Invention

The present invention relates to a touch panel.

Description of Related Art

Since transparent conductors have both light transmittance and appropriate conductivity, transparent conductors can be applied in devices having a display panel or a touch panel. Generally speaking, the transparent conductors may be various metal oxides, such as indium tin oxide (ITO), indium zinc oxide (IZO), cadmium tin oxide (CTO), or aluminum-doped zinc oxide (AZO). However, certain properties of these metal oxide films have made the use of metal oxide films challenging, such as insufficient flexibility. Under some circumstances, the metal oxide films, when patterned, may also pose a problem because the patterned metal oxide films are easily observed by the user. Therefore, a variety of transparent conductors have been developed recently, for example, transparent conductors made of materials such as nanowires, etc.

However, when the nanowires are utilized to form electrodes of touch panels, the nanowires and the peripheral traces have many problems that need to be solved with respect to their processes and structures. For example, if high-temperature lithography and etching processes are used to directly fabricate the peripheral traces on the touch electrodes, a protective layer is usually required to protect the nanowires because an etchant of strong acid is liable to cause damage to the nanowires. Since materials of a typical protective layer are relatively incapable of withstanding a high temperature, and optical issues also need to be considered, there are fewer materials that can be chosen. Overall speaking, the cost is increased in terms of either lithography-etching processes or material selection. In another technology, if a laser process associated with silver ink is used to directly fabricate the peripheral traces on the touch electrodes, the requirement or desire for a touch panel having a narrow bezel cannot be achieved due to the accuracy of the laser process.

SUMMARY

In some embodiments of the present invention, the touch electrode(s) and the peripheral trace(s) of a touch panel are respectively formed on different substrates, and the touch electrode(s) and the peripheral trace(s) indirectly contact each other through a conductive adhesive to achieve electrical connection. In addition, the substrate for carrying the peripheral trace(s) adopts a hollow design corresponding to the display area of the touch panel. In this manner, not only can the damage to the touch electrode(s) caused by the etching process of the peripheral trace(s) be avoided, but also the overall optical effect of the touch panel is not affected. Additionally, because the peripheral trace(s) are formed on another substrate and not limited by the space around the touch electrode(s), the embodiments disclosed herein have a more flexible application and design. The aesthetic appearance of a narrow bezel of the touch panel can be achieved.

According to some embodiments, a touch panel has a visible area and a peripheral area. The touch panel comprises a first substrate, a first metal nanowire layer, a first wiring component, and a first conductive adhesive layer. The first metal nanowire layer is formed on a surface of the first substrate and is patterned to comprise a first sensing part located corresponding to the visible area and a first connecting part located corresponding to the peripheral area. The first wiring component comprises a first carrier plate and a first peripheral trace. The first carrier plate is located corresponding to the peripheral area and has a hollow design corresponding to the visible area. The first peripheral trace is disposed on a surface of a side of the first carrier plate adjacent to the first metal nanowire layer. The first conductive adhesive layer is disposed between the first metal nanowire layer and the first wiring component and located corresponding to the peripheral area for electrically connecting the first connecting part with the first peripheral trace and fixing the first wiring component to the first metal nanowire layer.

In some embodiments of the present invention, the first peripheral trace comprises a metal wire and an insulating layer covering the metal wire.

In some embodiments of the present invention, one end of the first peripheral trace is a first overlapping part electrically connected to the first conductive adhesive layer, and another end of the first peripheral trace is a bonding pad electrically connected to a flexible printed circuit board.

In some embodiments of the present invention, the first conductive adhesive layer comprises a first conductive adhesive and a first insulating adhesive surrounding the first conductive adhesive. The first connecting part, the first conductive adhesive, and the first overlapping part overlap in a vertical projection direction.

In some embodiments of the present invention, the touch panel further comprises an overcoat disposed on the first metal nanowire layer.

According to some embodiments of the present invention, the touch panel further comprises a cover plate bonded to a surface of a side of the first substrate that is away from the first metal nanowire layer, or bonded to surfaces of the first metal nanowire layer and the first carrier plate away from the first substrate, through an optical adhesive.

In some embodiments of the present invention, the touch panel further comprises a second metal nanowire layer, a second wiring component, and a second conductive adhesive layer. The second metal nanowire layer is formed on a surface of a side of the first substrate that is away from the first metal nanowire layer, and the second metal nanowire layer is patterned to comprise a second sensing part located corresponding to the visible area and a second connecting part located corresponding to the peripheral area. The second wiring component comprises a second carrier plate and a second peripheral trace. The second carrier plate is located corresponding to the peripheral area and has a hollow design corresponding to the visible area. The second peripheral trace is formed on a surface of a side of the second carrier plate that is adjacent to the second metal nanowire layer. The second conductive adhesive layer is disposed between the second metal nanowire layer and the second wiring component and located corresponding to the peripheral area for electrically connecting the second connecting part with the second peripheral trace and fixing the second wiring component to the second metal nanowire layer.

In some embodiments of the present invention, each of the first peripheral trace and the second peripheral trace comprises a metal wire and an insulating layer covering the metal wire.

In some embodiments of the present invention, one end of the first peripheral trace is a first overlapping part electrically connected to the first conductive adhesive layer, and another end of the first peripheral trace is a first bonding pad for electrically connected to a flexible printed circuit board. One end of the second peripheral trace is a second overlapping part electrically connected to the second conductive adhesive layer, and another end of the second peripheral trace is a second bonding pad electrically connected to the flexible printed circuit board.

In some embodiments of the present invention, the first conductive adhesive layer comprises a first conductive adhesive and a first insulating adhesive surrounding the first conductive adhesive. The first connecting part, the first conductive adhesive, and the first overlapping part overlap in a vertical projection direction. The second conductive adhesive layer comprises a second conductive adhesive and a second insulating adhesive surrounding the second conductive adhesive. The second connecting part, the second conductive adhesive, and the second overlapping part overlap in the vertical projection direction.

In some embodiments of the present invention, the first carrier plate and the second carrier plate are integrated into a same carrier plate.

In some embodiments of the present invention, the touch panel further comprises an overcoat disposed on each of the first metal nanowire layer and the second metal nanowire layer.

In some embodiments of the present invention, the touch panel further comprises a cover plate bonded to surfaces of sides of the first metal nanowire layer and the first carrier plate that are away from the first substrate through an optical adhesive.

According to some embodiments of the present invention, the touch panel further comprises a second substrate, a second metal nanowire layer, a second wiring component, and a second conductive adhesive layer. The second substrate is overlapped with the first substrate. The second metal nanowire layer is formed on a surface of the second substrate and is patterned to comprise a second sensing part located corresponding to the visible area and a second connecting part located corresponding to the peripheral area. The second wiring component comprises a second carrier plate and a second peripheral trace. The second carrier plate is located corresponding to the peripheral area and has a hollow design corresponding to the visible area. The second peripheral trace is formed on a surface of a side of the second carrier plate that is adjacent to the second metal nanowire layer. The second conductive adhesive layer is disposed between the second metal nanowire layer and the second wiring component and located corresponding to the peripheral area for electrically connecting the second connecting part with the second peripheral trace and fixing the second wiring component to the second metal nanowire layer.

In some embodiments of the present invention, the touch panel further comprises an optical adhesive layer disposed between the first substrate and the second substrate. The first substrate is between the first metal nanowire layer and the optical adhesive layer, and the second substrate is between the second metal nanowire layer and the optical adhesive layer.

In some embodiments of the present invention, the touch panel further comprises an optical adhesive layer disposed between the first substrate and the second substrate. The first substrate is between the first metal nanowire layer and the optical adhesive layer, and the second metal nanowire layer is between the optical adhesive layer and the second substrate.

In some embodiments of the present invention, each of the first peripheral trace and the second peripheral trace comprises a metal wire and an insulating layer covering the metal wire.

In some embodiments of the present invention, one end of the first peripheral trace is a first overlapping part electrically connected to the first conductive adhesive layer, and another end of the first peripheral trace is a first bonding pad electrically connected to a flexible printed circuit board. One end of the second peripheral trace is a second overlapping part electrically connected to the second conductive adhesive layer, and another end of the second peripheral trace is a second bonding pad electrically connected to the flexible printed circuit board.

In some embodiments of the present invention, the first conductive adhesive layer comprises a first conductive adhesive and a first insulating adhesive surrounding the first conductive adhesive. The first connecting part, the first conductive adhesive, and the first overlapping part overlap in a vertical projection direction. The second conductive adhesive layer comprises a second conductive adhesive and a second insulating adhesive surrounding the second conductive adhesive. The second connecting part, the second conductive adhesive, and the second overlapping part overlap in the vertical projection direction.

In some embodiments of the present invention, the touch panel further comprises an overcoat disposed on each of the first metal nanowire layer and the second metal nanowire layer.

In some embodiments of the present invention, the touch panel further comprises a cover plate bonded to surfaces of the first metal nanowire layer and the first carrier plate that are away from the first substrate, or bonded to a surface of a side of the second substrate that is away from the second metal nanowire layer, through an optical adhesive.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and components are schematically depicted in order to simplify the drawings.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated. It will be understood that, words indicating relative position relationship used in the description herein, such as "above," "below," "left," and "right," are relative position relationships as they relate to the accompanying drawings. Therefore, such words indicating relative position relationship are used for illustration and do not limit the present invention.

Figure 1:
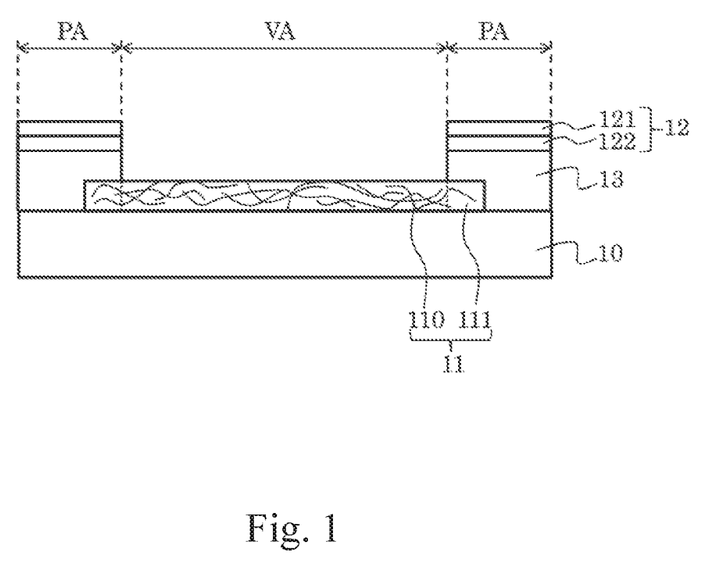
FIG. 1 depicts a cross-sectional schematic diagram of a touch panel according to one embodiment of this invention.

FIG. 1 depicts a cross-sectional schematic diagram of a touch panel according to one embodiment of this invention. The touch panel according to the present embodiment is a structure in which a single-layered electrode of the touch panel (hereinafter referred to as "touch electrode") is formed on a substrate. The touch panel comprises a first substrate 10, a first metal nanowire layer 11, a first wiring component 12, and a first conductive adhesive layer 13. The first metal nanowire layer 11 is formed on a surface of the first substrate 10. The first conductive adhesive layer 13 is disposed between the first metal nanowire layer 11 and the first wiring component 12. In the present embodiment, none of the first wiring component 12, used for transmitting signals, on the first metal nanowire layer 11 is formed using lithographic and etching processes or a laser etching process. Rather, the first wiring component 12 that has been pre-formed is bonded to the first metal nanowire layer 11 through the first conductive adhesive layer 13, so that the first metal nanowire layer 11 and the first wiring component 12 are electrically contacted indirectly. As a result, the damage to the first metal nanowire layer 11 caused by the etching process can be avoided.

Figure 2:
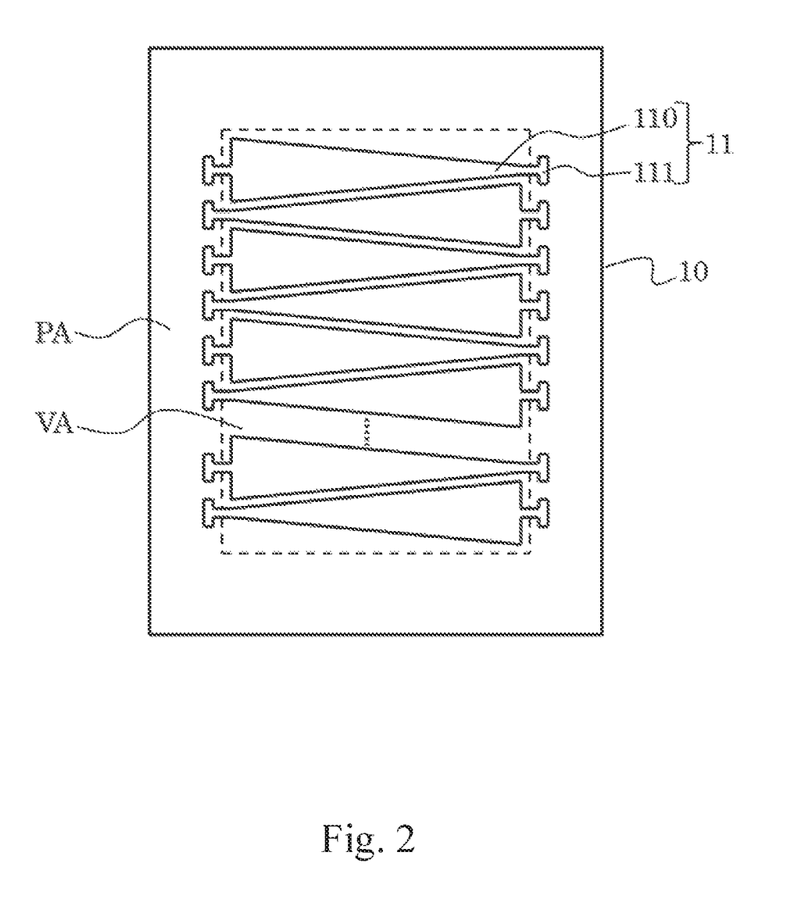
FIG. 2 depicts a top schematic diagram of a metal nanowire layer according to one embodiment of this invention.

Reference is made to FIG. 2, which depicts a top schematic diagram of a metal nanowire layer according to one embodiment of this invention. The touch panel according to the present embodiment has a visible area VA and a peripheral area PA. The peripheral area PA is disposed adjacent to at least one side of the visible area VA. For example, the peripheral area PA may be disposed around the visible area VA, that is, located on an upper side, a lower side, a left side, and a right side of the visible area VA as shown in the present embodiment so as to form a frame area surrounding the visible area VA. Of course, the peripheral area PA may be an L-shaped area disposed on the left side and the lower side of the visible area VA in other embodiments.

The first metal nanowire layer 11 is formed on the surface of the first substrate 10, and may be patterned to comprise a first sensing part 110 located corresponding to the visible area VA and a first connecting part 111 located corresponding to the peripheral area PA. Since in the present embodiment the first metal nanowire layer 11 is formed by performing the same patterning process on the same material layer, the first sensing part 110 and the first connecting part 111 are integrally formed. The first sensing part 110 according to the present embodiment is, for example, a pattern designed as a single-layered touch electrode. The number of touch electrodes may be one or more, and a shape of the touch electrode(s) may be designed depending on practical needs, and the present invention is not limited in this regard. Taking FIG. 2 as an example, in which a plurality of touch electrodes are parallel and insulatively arranged, the first connecting parts 111 are arranged corresponding to each of the touch electrodes, and two ends of each of the touch electrodes according to the present embodiment are respectively formed with the first connecting parts 111 to meet the design requirement of double routing. In other embodiments, the first connecting part 111 may be designed to be disposed at only one of the two ends of the touch electrode to meet the design requirement of single routing.

Figure 3:
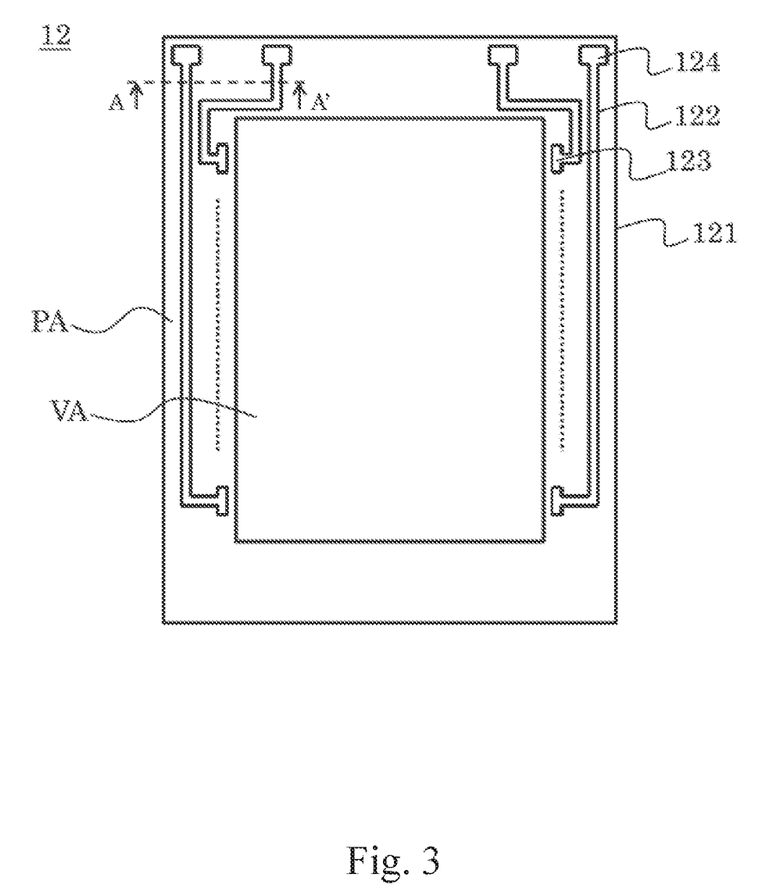
FIG. 3 depicts a bottom schematic diagram of a wiring component according to one embodiment of this invention.

Reference is made to FIG. 3. FIG. 3 depicts a bottom schematic diagram of a wiring component according to one embodiment of this invention. The first wiring component 12 of the present embodiment comprises a first carrier plate 121 and a first peripheral trace 122. The first carrier plate 121 is located corresponding to the peripheral area PA and has a hollow design corresponding to the visible area VA. In greater detail, the first carrier plate 121 of the present embodiment is of a frame type, and a center area has a hollow design. As a result, the first wiring component 12 of the present embodiment will not affect the optical effect of the touch panel in the entire visible area VA.

The first peripheral trace 122 is formed on a surface of a side of the first carrier plate 121 that is adjacent to the first metal nanowire layer 11. In the present embodiment, one end of the first peripheral trace 122 is a first overlapping part 123 for electrically connecting to the first conductive adhesive layer 13. Another end of the first peripheral trace 122 is a first bonding pad 124 for electrically connecting to a flexible printed circuit board (not shown in the figure). The first carrier plate 121 may be a rigid substrate or a flexible substrate. The material of the first carrier plate 121 may be selected from glass, polymethylmethacrylate (PMMA), polyvinyl chloride (PVC), polypropylene (PP), polyethylene terephthalate (PET), polyethylene naphthalate (PEN), polycarbonate (PC), polystyrene and (PS), and the like. In addition, since the first wiring component 12 is located in the peripheral area PA, the first carrier plate 121 may be a transparent or a non-transparent substrate. The first peripheral trace 122 comprises a metal wire 1221 and an insulating layer 1222 covering the metal wire 1221. The material of the metal wire 1221 may be selected, for example, from conductive materials such as copper, silver, and the like.

Figure 4A:
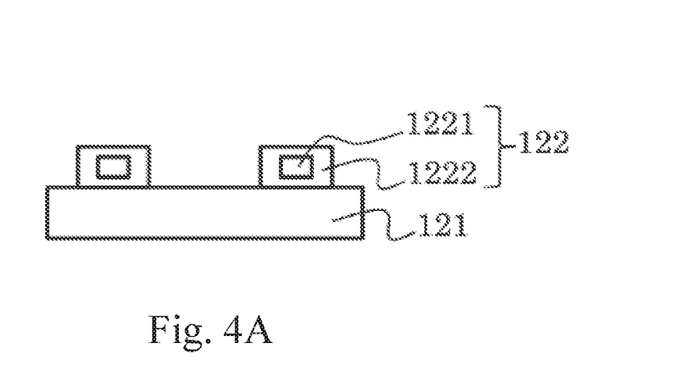
FIG. 4A depicts a cross-sectional schematic diagram of one embodiment taken along line A-A' of FIG. 3.

Reference is made to FIG. 4A. FIG. 4A depicts a cross-sectional schematic diagram of one embodiment taken along line A-A' of FIG. 3. In the present embodiment, the metal wire 1221 is firstly coated with the insulating layer 1222, and a layer of adhesive is applied on the surface of the first carrier plate 121. Thereafter, the metal wire 1221 coated with the insulating layer 1222 is attached to the adhesive by using a print bonding method, and then a curing process is carried out to form the structure shown.

Figure 4B:
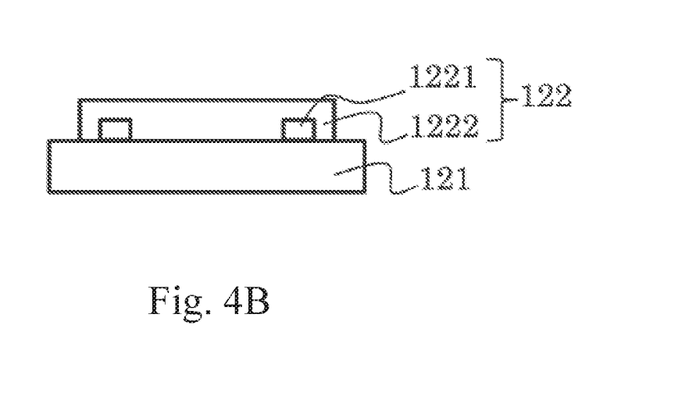
FIG. 4B depicts a cross-sectional schematic diagram of another embodiment taken along line A-A' of FIG. 3.

Reference is made to FIG. 4B. FIG. 4B depicts a cross-sectional schematic diagram of another embodiment taken along line A-A' of FIG. 3. In the present embodiment, the metal wires 1221 are firstly formed on the surface of the first carrier plate 121 by using a printing or etching method. Thereafter, the insulating layer 1222 is applied to cover the metal wires 1221, and then a curing process is performed.

As described hereinbefore, if the first carrier plate 121 adopts a design of a flexible substrate, the first wiring component 12 becomes a flexible substrate that is bendable and can be bent on the side-edge of the first substrate 10. In addition, there is no need to reserve a wiring space around the first metal nanowire layer 11 on the first substrate 10. As a result, the space design can be more flexible, and the narrow bezel of the touch panel can be achieved.

Figure 5:
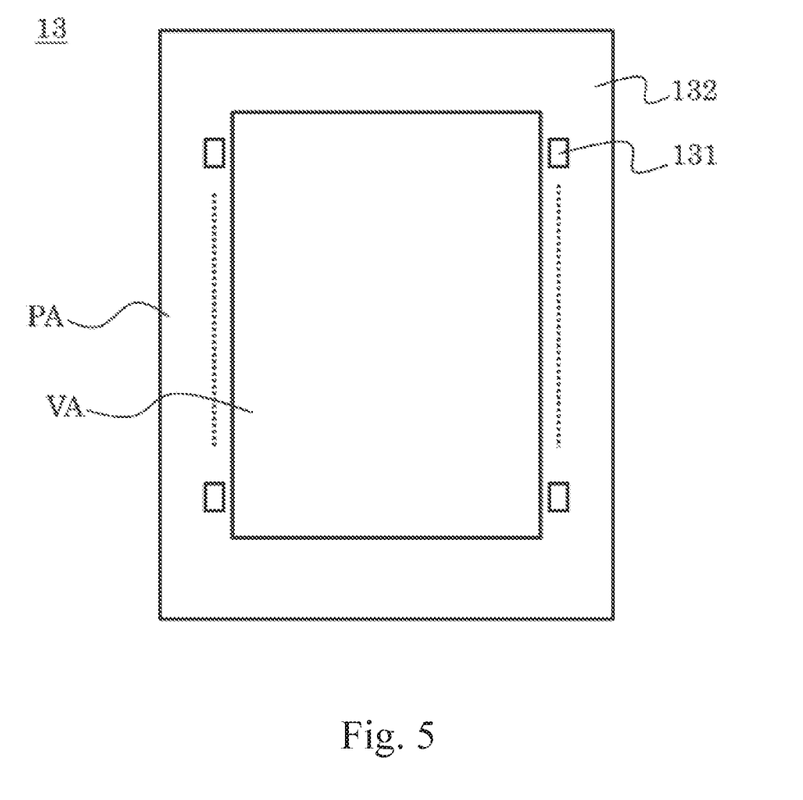
FIG. 5 depicts a top schematic diagram of a conductive adhesive layer according to one embodiment of this invention.

Reference is made to FIG. 5. FIG. 5 depicts a top schematic diagram of a conductive adhesive layer according to one embodiment of this invention. The first conductive adhesive layer 13 of the present embodiment is disposed between the first metal nanowire layer 11 and the first wiring component 12 and corresponds to the peripheral area PA for electrically connecting the first connecting part 111 of the first metal nanowire layer 11 to the first overlapping part 123 of the first peripheral trace 122. The first conductive adhesive layer 13 allows the first wiring component 12 to be fixed to the first metal nanowire layer 11. In the present embodiment, the first conductive adhesive layer 13 comprises a first conductive adhesive 131 and a first insulating adhesive 132 surrounding the first conductive adhesive 131. The first connecting part 111, the first conductive adhesive 131, and the first overlapping part 123 are overlapped in a vertical projection direction. As a result, the first conductive adhesive 131 may be used to electrically connect the first connecting part 111 with the first overlapping part 123, and the first insulating adhesive 132 may be used to provide a fixing function such that the first wiring component 12 is stably fixed to the first metal nanowire layer 11.

In another embodiment, the first conductive adhesive layer 13 may be an anisotropic conductive adhesive, and the first conductive adhesive layer 13 is applied to the entire area of the peripheral area PA so that the first connecting part 111 and the first overlapping part 123 are electrically connected through the anisotropic conductive adhesive such that current only flows in the vertical direction.

Similarly, in terms of the selection of the material of the first conductive adhesive layer 13, there is no need to consider whether the material thereof is transparent or not because the first conductive adhesive layer 13 is located corresponding to the peripheral area PA, thereby enlarging the choices of materials.

Based on the structure mentioned above, the touch panel according to the present embodiment may further comprise a cover plate (not shown in the figure) which provides protection and enhance the durability of the touch panel. The cover plate may comprise a decorative layer (not shown in the figure) for defining the peripheral area PA of the touch panel, and the cover plate may be a rigid transparent substrate or a flexible transparent substrate. According to one embodiment, the cover plate may be bonded to the surface of the side of the first substrate 10 that is away from the first metal nanowire layer 11 (e.g., the lower surface of the first substrate 10 shown in FIG. 1), using an optical adhesive (not shown in the figure). However, according to another embodiment, the cover plate may be bonded to the surfaces of the first metal nanowire layer 11 and the first carrier plate 121 away from the first substrate 10 (the upper surfaces of the first metal nanowire layer 11 and the first carrier plate 121 shown in FIG. 1) using an optical adhesive. In this case, not only is the optical adhesive bonded to the upper surface of the first carrier plate 121, but the optical adhesive is also filled in a center hollow area because of the hollow designs of the first wiring component 12 and the first conductive adhesive layer 13 in the visible area VA and is directly bonded to the upper surface of the first metal nanowire layer 11.

The related processes and materials for forming the first metal nanowire layer 11 on the first substrate 10 according to the present embodiment are described in details hereinafter.

First, the first metal nanowire layer 11 may be comprised of at least metal nanowires. In some processes, a dispersion or ink having metal nanowires is applied on the first substrate 10 and then dried so that the metal nanowires cover the surface of the first substrate 10. In other words, the metal nanowires form the first metal nanowire layer 11 disposed on the first substrate 10 due to the drying and curing step described above.

The dispersion having the metal nanowires may be a solvent such as water, alcohol, ketone, ether, hydrocarbon, or an aromatic solvent (for example benzene, toluene, xylene, etc.). The dispersion described above may further comprise an additive, a surfactant, or a binder such as carboxymethyl cellulose (CMC), hydroxyethyl cellulose (HEC), hydroxypropyl methylcellulose (HPMC), sulfonic ester, sulfuric acid, disulfonic acid salt, sulfosuccinate, phosphate ester, fluorine-containing surfactant, etc. The metal nanowire layer may be formed of a silver nanowire layer, a gold nanowire layer, or a copper nanowire layer, for example. In greater detail, the "metal nanowires" used herein is a collective term, which refers to a collection of metal wires comprising a plurality of elemental metals, metal alloys, or metal compounds (including metal oxides). The number of metal nanowires contained therein does not affect the protection scope claimed by the present invention, and at least one cross-sectional dimension (that is, the diameter of the cross-section) of a single metal nanowire is less than 500 nm, preferably less than 100 nm, and more preferably less than 50 nm. In the present invention, the so-called "wire" of the metal nanostructure mainly has a high aspect ratio, for example, between 10 and 100,000. In greater detail, the aspect ratio of the metal nanowire (length: diameter of the cross-section) may be greater than 10, preferably greater than 50, and more preferably greater than 100. The metal nanowire may be any metal, including but not limited to, silver, gold, copper, nickel, or gold-plated silver. Other terms, such as silk, fiber, tube, etc., are also within the scope of the present invention if it has the same dimensions and high aspect ratios described above.

The dispersion or ink containing the metal nanowires may be formed on the surface of the first substrate 10 by any methods, for example but not limited to, screen printing, nozzle coating, roller coating, and the like. In one embodiment, a roll-to-roll process may be adopted to coat the dispersion or ink containing the metal nanowires on surfaces of the first substrate 10, in which the first substrate 10 is continuously supplied. After the curing/drying step described above, the solvent or the like is volatilized, and the metal nanowires are distributed on the surface of the first substrate 10 in a random manner Preferably, the metal nanowires are fixed to the surface of the first substrate 10 without detachment so as to form the first metal nanowire layer 11, and the metal nanowires are in contact with each other to provide a continuous current path, thus forming a conductive network.

In some embodiments of the present invention, the metal nanowires may be silver nanowires or silver nanofibers, which may have an average diameter from about 20 to about 100 nanometers and an average length from about 20 to about 100 micrometers, preferably an average diameter from about 20 to about 70 nanometers and an average length from about 20 to about 70 micrometers (that is, an aspect ratio of 1000). In some embodiments, the diameter of the metal nanowires may range from 70 nanometers to 80 nanometers and the length of the metal nanowires may be about 8 micrometers.

In one embodiment, the touch panel further comprises an overcoat (not shown in the figure) disposed on the first metal nanowire layer 11. The present invention is not limited to certain physical structures and relationships between the overcoat and the first metal nanowire layer 11. For example, the overcoat and the first metal nanowire layer 11 may form a stack of two layers, or the overcoat and the first metal nanowire layer 11 may be combined with each other to form a composite layer. Preferably, the first metal nanowire layer 11 is formed into a composite type, in which metal nanowires are embedded in the overcoat layer and then are patterned in a subsequent process. The patterning process may be, for example, photolithographic and etching processes to form the pattern of the touch electrode including the first sensing part 110 located corresponding to the visible area VA and the first connecting parts 111 located corresponding to the peripheral area PA (as shown in FIG. 2).

Finally, the first metal nanowire layer 11 fabricated according to the present embodiment preferably has the following characteristics: the transmittance of visible light (for example, the wavelength between about 400 nm and about 700 nm) may be greater than about 80%, and the surface resistance is between about 10 and about 1000 ohms/square. Preferably, the visible light transmittance (for example, the wavelength between about 400 nm and about 700 nm) of the first metal nanowire layer 11 is greater than about 85%, and the surface resistance is between about 50 and about 500 ohms/square.

Figure 6:
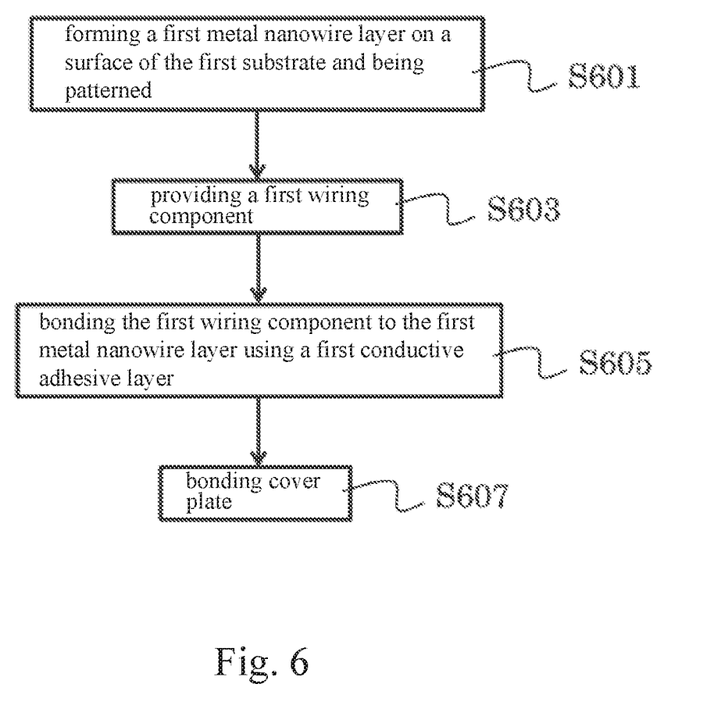
FIG. 6 depicts a flowchart of a manufacturing method of a touch panel according to one embodiment of this invention.

Reference is made to FIG. 6, which is a flowchart illustrating a method of manufacturing a touch panel according to one embodiment of the present invention. The present embodiment is described by using the structure of the touch panel illustrated in the embodiment shown in FIG. 1. Steps of the method of manufacturing the touch panel comprise: firstly forming the first metal nanowire layer 11 on a surface of the first substrate 10 and performing a patterning process (S601) to form the first sensing part 110 and the first connecting part 111. In addition, the first wiring component 12 is provided (S603), in which the first wiring component 12 comprises the first carrier plate 121 and the first peripheral trace 122.

Then, the first conductive adhesive layer 13 is utilized to bond the first wiring component 12 to the first metal nanowire layer 11 (S605), so that the first peripheral trace 122 is electrically connected to the first connecting part 111, and the first wiring component 12 is fixed to the first metal nanowire layer 11. Finally, a cover plate is bonded (S607). An optical adhesive is utilized to bond the cover plate to a surface of the first substrate 10 that is away from the first metal nanowire layer 11 or surfaces of the first metal nanowire layer 11 and the first carrier plate 121 away from the first substrate 10. In this manner, the manufacturing of the touch panel of the present embodiment is completed. The foregoing description above can be referred to for the specific structure and detailed process in the steps described and is not repeatedly described herein.

Since the touch panel has a variety of designs in the stack structure of the touch electrode and the substrate, depending on practical needs, some embodiments of the touch panel are further provided below for illustration.

Figure 7:
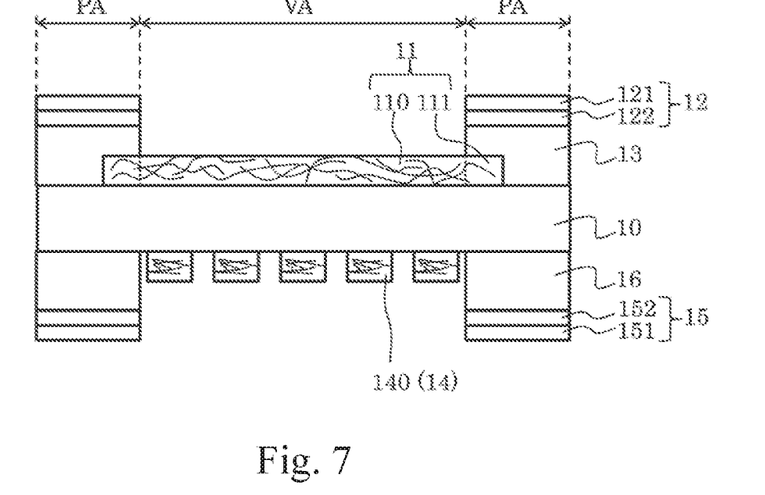
FIG. 7 depicts a cross-sectional schematic diagram of a touch panel according to another embodiment of this invention.

Reference is made to FIG. 7, which is a cross-sectional view schematically illustrating a touch panel according to another embodiment of this invention. The touch panel according to the present embodiment is approximately the same as the touch panel of the embodiment shown FIG. 1. The difference lies in that the touch panel according to the present embodiment has a structure in which double layers of touch electrodes are formed on a substrate, and the two layers of touch electrodes are respectively formed on two opposite surfaces of the substrate. In this sense, the same elements as those in the embodiment of FIG. 1 are denoted by the same reference numerals, and the description in this regard is not repeatedly provided and only the differences will be described.

The touch panel according to the present embodiment further comprises a second metal nanowire layer 14, a second wiring component 15, and a second conductive adhesive layers 16. The second metal nanowire layer 14 is formed on a surface of the first substrate 10 that is away from the first metal nanowire layer 11 (e.g., a lower surface of the first substrate 10), and the second metal nanowire layer 14 after being patterned comprises a second sensing part 140 located corresponding to the visible area VA and a second connecting part (not shown in the figure) located corresponding to the peripheral area PA. Since in the present embodiment the second metal nanowire layer 14 is formed by performing the same patterning process on the same material layer, the second sensing part 140 and the second connecting part are integrally formed. The first metal nanowire layer 11 of the present embodiment is, for example, a touch electrode formed along the X-axis, and the second metal nanowire layer 14 is, for example, a touch electrode formed along the Y-axis. The number of touch electrodes in each of the first metal nanowire layer 11 and the second metal nanowire layer 14 may be one or more. The shapes of the touch electrodes may be designed in any suitable manner, depending on practical needs, and the present invention is not limited in this regard. Additionally, the second connecting parts may be correspondingly disposed at two ends of each of the touch electrodes, or the second connecting parts may be disposed at one of the two ends of each of the touch electrodes, in order to meet the design requirement for double routing or single routing.

The second wiring component 15 comprises a second carrier plate 151 and a second peripheral trace 152. The second carrier plate 151 is located corresponding to the peripheral area PA, and has a hollow design corresponding to the visible area VA. In greater detail, the second carrier plate 151 of the present embodiment is frame-typed, and a center region has a hollow design. As a result, the second wiring component 15 of the present embodiment will not affect the optical effect of the touch panel in the entire visible area VA. The second peripheral trace 152 is formed on a surface of side of the second carrier plate 151 that is adjacent to the second metal nanowire layer 14. In the present embodiment, one end of the second peripheral trace 152 is a second overlapping part (not shown in the figure) for electrically connecting to the second conductive adhesive layer 16. Another end of the second peripheral trace 152 is a second bonding pad (not shown in the figure) for electrically connecting to the flexible printed circuit board (not shown in the figure). The detailed structural design and material of the second wiring component 15 in the present embodiment are approximately the same as those of the first wiring component 12, and only the routing paths are different due to the axial designs of the touch electrodes. The description thereof is not repeatedly described herein.

The second conductive adhesive layer 16 is disposed between the second metal nanowire layer 14 and the second wiring component 15 and is located corresponding to the peripheral area PA for electrically connecting the second connecting part of the second metal nanowire layer 14 with the second overlapping part of the second peripheral trace 152. The second conductive adhesive layer 16 allows the second wiring component 15 to be fixed to the second metal nanowire layer 14. In the present embodiment, the second conductive adhesive layer 16 comprises a second conductive adhesive (not shown in the figure) and a second insulating adhesive (not shown in the figure) surrounding the second conductive adhesive. Since the detailed structural design and material of the second conductive adhesive layer 16 are approximately the same as those of the first conductive adhesive layer 13, and only the relative positions of the adhesives are different due to the axial designs of the touch electrodes, the description in this regard is not repeatedly described herein. The first connecting part 111, the first conductive adhesive 131, and the first overlapping part 123 are overlapped in a vertical projection direction, and the second connecting part, the second conductive adhesive, and the second overlapping part are overlapped in the vertical projection direction.

In another embodiment, if the first carrier plate 121 and the second carrier plate 151 both adopt a design of flexible substrates, the first carrier plate 121 and the second carrier plate 151 may be designed and integrated into a same carrier plate, and the first peripheral trace 122 and the second peripheral trace 152 are formed on opposite surfaces of the same carrier plate. As a result, the first peripheral trace 122 is allowed to be bonded to the first conductive adhesive layer 13 on an upper side of the first substrate 10, and the second peripheral trace 152 is allowed to be bended and bonded to the second conductive adhesive layer 16 on a lower side of the first substrate 10.

In some embodiments, the touch panel further comprises an overcoat (not shown in the figure) disposed on each of the first metal nanowire layer 11 and the second metal nanowire layer 14 and a cover plate (not shown in the figure). The physical structures and relationships among the overcoat, the first metal nanowire layer 11, and the second metal nanowire layer 14 may be the same as or similar to those described hereinbefore. The cover plate (not shown in the figure) is bonded to the surfaces of the first metal nanowire layer 11 and the first carrier plate 121 that are away from the first substrate 10, or is bonded to the surfaces of the second metal nanowire layer 14 and the second carrier plate 151 that are away from first substrate 10, by using an optical adhesive (not shown in the figure).

Figure 8:
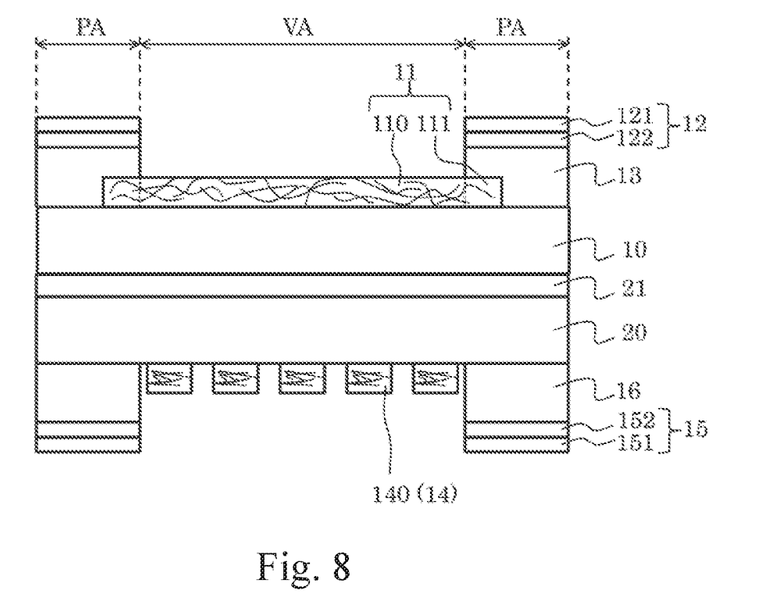
FIG. 8 depicts a cross-sectional schematic diagram of a touch panel according to still another embodiment of this invention.
Figure 9:
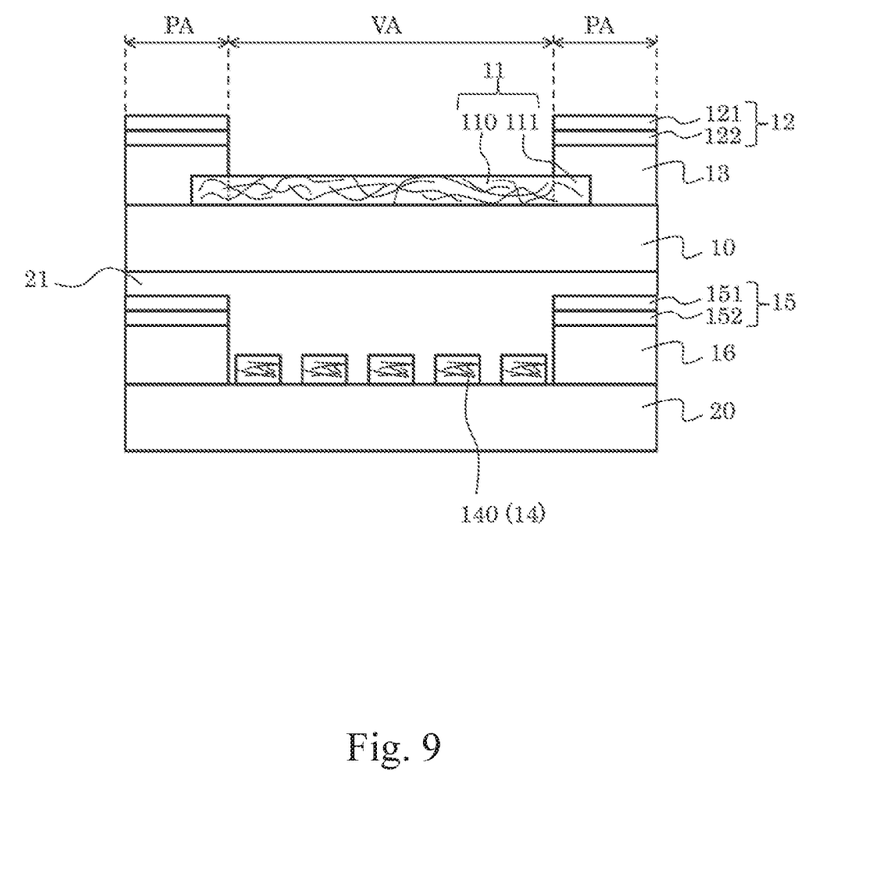
FIG. 9 depicts a cross-sectional schematic diagram of a touch panel according to yet another embodiment of this invention.

Reference is made to FIG. 8 and FIG. 9. FIG. 8 depicts a cross-sectional schematic diagram of a touch panel according to still another embodiment of this invention. FIG. 9 depicts a cross-sectional schematic diagram of a touch panel according to yet another embodiment of this invention. The touch panels of the two embodiments are approximately the same as the touch panel of the embodiment shown in FIG. 7. Both of FIGS. 8 and 9 are double-layered touch electrode structures. The difference between FIG. 7 and FIGS. 8 and 9 lies in that a layer of touch electrode is formed on each of the two substrate layers, and the two substrate layers are then bonded together. The difference between the two embodiments of FIGS. 8 and 9 is in that the bonding directions are different. Similarly, the same elements as those in the embodiment of FIG. 7 are denoted by the same reference numerals, and a description in this regard is not repeatedly described and only the differences will be described hereinafter.

Each of the touch panels of the embodiments shown in FIG. 8 and FIG. 9 further comprises a second substrate 20 that is overlapped with the first substrate 10, for example, the second substrate 20 being disposed underneath the first substrate 10. Additionally, the second metal nanowire layer 14 is formed on a surface of the second substrate 20. In greater detail, the touch panel further comprises an optical adhesive layer 21 disposed between the first substrate 10 and the second substrate 20. In the embodiment of FIG. 8, the optical adhesive layer 21 is bonded to a surface of the first substrate 10 (such as a lower surface) and a surface of the second substrate 20 (such as an upper surface). More specifically, the first substrate 10 is between the first metal nanowire layer 11 and the optical adhesive layer 21, and the second substrate 20 is between the second metal nanowire layer 14 and the optical adhesive layer 21. In the embodiment of FIG. 9, the optical adhesive layer 21 is bonded to a surface of the first substrate 10 (such as the lower surface) and a surface of the second carrier plate 151 that is away from the second substrate 20 (such as an upper surface). Because the second wiring component 15 and the second conductive adhesive layer 16 have a hollow design in the visible area VA, the optical adhesive layer 21 is filled in a hollow center area and directly bonded to a surface of the second metal nanowire layer 14 (such as an upper surface). In particular, the first substrate 10 is between the first metal nanowire layer 11 and the optical adhesive layer 21, and the second metal nanowire layer 14 is between the optical adhesive layer 21 and the second substrate 20.

In addition, each of the touch panels of the embodiments shown in FIG. 8 and FIG. 9 further comprises a cover plate (not shown in the figure). In the embodiment of FIG. 8, the cover plate is bonded to the surfaces of the first metal nanowire layer 11 and the first carrier plate 121 that are away from the first substrate 10 (such as upper surfaces), or is bonded to the surfaces of the second metal nanowire layer 14 and the second carrier plate 151 that are away from the second substrate 20 (such as lower surfaces), by using an optical adhesive (not shown). In the embodiment of FIG. 9, the cover plate is bonded to the surfaces of the first metal nanowire layer 11 and the first carrier plate 121 that are away from a side of the first substrate 10 (such as the upper surfaces), or is bonded to a surface of the second substrate 20 (such as a lower surface), by using an optical adhesive (not shown).

It is noted that each of the touch panels comprises at least three layers of film materials (i.e., the cover plate, the first substrate 10, and the second substrate 20), in the structures of the embodiments shown in FIG. 8 and FIG. 9. Hence, it is necessary to consider the optically aesthetic appearance. Through the hollow design of the first wiring component 12 and the second wiring component 15 in the center area according to the present invention, the overall optical effect of the touch panel will not be affected at all.

In summary, according to some embodiments of the present invention, the touch electrode(s) and the peripheral trace(s) of the touch panel are respectively formed on different substrates, and the touch electrode(s) and the peripheral trace(s) indirectly contact each other through a conductive adhesive to achieve electrical connection. The substrate for carrying the peripheral trace(s) adopts a hollow design corresponding to the display area of the touch panel. Not only can damage to the touch electrode(s) caused by the etching process of the peripheral trace(s) be avoided, but also the overall optical effect of the touch panel is not affected. In addition, the peripheral trace(s) formed on another substrate is not limited by the space around the touch electrode(s), so the embodiments disclosed herein have a more flexible application and design. The aesthetic appearance of a narrow bezel of the touch panel can be achieved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch panel having a visible area and a peripheral area comprising:
   a first substrate;
   a first metal nanowire layer formed on a surface of the first substrate, wherein the first metal nanowire layer is patterned to comprise a first sensing part located corresponding to the visible area and a first connecting part located corresponding to the peripheral area;
   a first wiring component comprising a first carrier plate and a first peripheral trace,
      wherein the first carrier plate is located corresponding to the peripheral area,
      wherein the first carrier plate has a hollow design corresponding to the visible area,
      wherein the first carrier plate is a flexible substrate, and
      wherein the first peripheral trace is disposed on a surface of a side of the first carrier plate that is adjacent to the first metal nanowire layer; and
   a first conductive adhesive layer disposed between the first metal nanowire layer and the first wiring component, wherein the first conductive adhesive layer is located corresponding to the peripheral area for electrically connecting the first connecting part with the first peripheral trace and fixing the first wiring component to the first metal nanowire layer.

2. The touch panel of claim 1, wherein the first peripheral trace comprises a metal wire and an insulating layer covering the metal wire.

3. The touch panel of claim 1, wherein one end of the first peripheral trace is a first overlapping part electrically connected to the first conductive adhesive layer and another end of the first peripheral trace is a bonding pad electrically connected to a flexible printed circuit board.

4. The touch panel of claim 3, wherein the first conductive adhesive layer comprises a first conductive adhesive and a first insulating adhesive surrounding the first conductive adhesive, and wherein the first connecting part, the first conductive adhesive, and the first overlapping part overlap in a vertical projection direction.

5. The touch panel of claim 1, further comprising an overcoat disposed on the first metal nanowire layer.

6. The touch panel of claim 1, further comprising a cover plate bonded to a surface of a side of the first substrate that is away from the first metal nanowire layer, or bonded to surfaces of the first metal nanowire layer and the first carrier plate away from the first substrate, through an optical adhesive.

7. The touch panel of claim 1, further comprising:
   a second metal nanowire layer formed on a surface of a side of the first substrate that is away from the first metal nanowire layer, wherein the second metal nanowire layer is patterned to comprise a second sensing part located corresponding to the visible area and a second connecting part located corresponding to the peripheral area;
   a second wiring component comprising a second carrier plate and a second peripheral trace, wherein the second carrier plate is located corresponding to the peripheral area, wherein the second carrier plate has a hollow design corresponding to the visible area, and wherein the second peripheral trace is formed on a surface of a side of the second carrier plate that is adjacent to the second metal nanowire layer; and
   a second conductive adhesive layer disposed between the second metal nanowire layer and the second wiring component, wherein the second conductive adhesive layer is located corresponding to the peripheral area for electrically connecting the second connecting part with the second peripheral trace and fixing the second wiring component to the second metal nanowire layer.

8. The touch panel of claim 7, wherein each of the first peripheral trace and the second peripheral trace comprises a metal wire and an insulating layer covering the metal wire.

9. The touch panel of claim 7, wherein one end of the first peripheral trace is a first overlapping part electrically connected to the first conductive adhesive layer and another end of the first peripheral trace is a first bonding pad electrically connected to a flexible printed circuit board, and wherein one end of the second peripheral trace is a second overlapping part electrically connected to the second conductive adhesive layer and another end of the second peripheral trace is a second bonding pad electrically connected to the flexible printed circuit board.

10. The touch panel of claim 9, wherein the first conductive adhesive layer comprises a first conductive adhesive and a first insulating adhesive surrounding the first conductive adhesive, wherein the first connecting part, the first conductive adhesive, and the first overlapping part overlap in a vertical projection direction, wherein the second conductive adhesive layer comprises a second conductive adhesive and a second insulating adhesive surrounding the second conductive adhesive, and wherein the second connecting part, the second conductive adhesive, and the second overlapping part overlap in the vertical projection direction.

11. The touch panel of claim 7, wherein the first carrier plate and the second carrier plate are integrated into a same carrier plate.

12. The touch panel of claim 7, further comprising an overcoat disposed on each of the first metal nanowire layer and the second metal nanowire layer.

13. The touch panel of claim 7, further comprising a cover plate bonded to surfaces of sides of the first metal nanowire layer and the first carrier plate that are away from the first substrate through an optical adhesive.

14. The touch panel of claim 1, further comprising:
   a second substrate overlapped with the first substrate;
   a second metal nanowire layer formed on a surface of the second substrate, wherein the second metal nanowire layer is patterned to comprise a second sensing part located corresponding to the visible area and a second connecting part located corresponding to the peripheral area;

a second wiring component comprising a second carrier plate and a second peripheral trace, wherein the second carrier plate is located corresponding to the peripheral area, wherein the second carrier plate has a hollow design corresponding to the visible area, and wherein the second peripheral trace is formed on a surface of a side of the second carrier plate that is adjacent to the second metal nanowire layer; and a second conductive adhesive layer disposed between the second metal nanowire layer and the second wiring component, wherein the second conductive adhesive layer is located corresponding to the peripheral area for electrically connecting the second connecting part with the second peripheral trace and fixing the second wiring component to the second metal nanowire layer.

15. The touch panel of claim 14, further comprising an optical adhesive layer disposed between the first substrate and the second substrate, wherein the first substrate is between the first metal nanowire layer and the optical adhesive layer, and wherein the second substrate is between the second metal nanowire layer and the optical adhesive layer.

16. The touch panel of claim 14, further comprising an optical adhesive layer disposed between the first substrate and the second substrate, wherein the first substrate is between the first metal nanowire layer and the optical adhesive layer, and wherein the second metal nanowire layer is between the optical adhesive layer and the second substrate.

17. The touch panel of claim 14, wherein one end of the first peripheral trace is a first overlapping part electrically connected to the first conductive adhesive layer and another end of the first peripheral trace is a first bonding pad electrically connected to a flexible printed circuit board, and wherein one end of the second peripheral trace is a second overlapping part electrically connected to the second conductive adhesive layer and another end of the second peripheral trace is a second bonding pad electrically connected to the flexible printed circuit board.

18. The touch panel of claim 17, wherein the first conductive adhesive layer comprises a first conductive adhesive and a first insulating adhesive surrounding the first conductive adhesive, wherein the first connecting part, the first conductive adhesive, and the first overlapping part overlap in a vertical projection direction, wherein the second conductive adhesive layer comprises a second conductive adhesive and a second insulating adhesive surrounding the second conductive adhesive, and wherein the second connecting part, the second conductive adhesive, and the second overlapping part overlap in the vertical projection direction.

19. The touch panel of claim 14, further comprising an overcoat disposed on each of the first metal nanowire layer and the second metal nanowire layer.

20. The touch panel of claim 14, further comprising a cover plate bonded to surfaces of the first metal nanowire layer and the first carrier plate that are away from the first substrate, or bonded to a surface of a side of the second substrate that is away from the second metal nanowire layer, through an optical adhesive.

* * * * *